United States Patent
Otsuka et al.

(12)

(10) Patent No.: US 9,301,404 B2
(45) Date of Patent: *Mar. 29, 2016

(54) CERAMIC SUBSTRATE AND METHOD OF MANUFACTURING THE SAME

(71) Applicant: NGK SPARK PLUG CO., LTD., Nagoya, Aichi (JP)

(72) Inventors: Yuma Otsuka, Komaki (JP); Kazunori Fukunaga, Inuyama (JP); Atsushi Uchida, Kakamigahara (JP); Kouhei Yoshimura, Nagoya (JP)

(73) Assignee: NGK SPARK PLUG CO. LTD, Nagoya (JP)

( * ) Notice: Subject to any disclaimer, the term of this patent is extended or adjusted under 35 U.S.C. 154(b) by 5 days.

This patent is subject to a terminal disclaimer.

(21) Appl. No.: 14/133,158

(22) Filed: Dec. 18, 2013

(65) Prior Publication Data

US 2014/0166349 A1  Jun. 19, 2014

(30) Foreign Application Priority Data

Dec. 19, 2012  (JP) ................. 2012-277275

(51) Int. Cl.
*H05K 1/03* (2006.01)
*H05K 1/18* (2006.01)
(Continued)

(52) U.S. Cl.
CPC ............ *H05K 3/4007* (2013.01); *C23C 28/021* (2013.01); *C23C 28/023* (2013.01); *H05K 1/0306* (2013.01); *H05K 1/18* (2013.01);
(Continued)

(58) Field of Classification Search
CPC . H05K 1/0306; H05K 3/4007; H05K 3/4629; H05K 3/429; H05K 3/246; H05K 1/03; H05K 1/092; H05K 1/097; H05K 1/11; H05K 1/18; H05K 1/181; C23C 30/00; C23C 28/021; C23C 28/023
USPC ................... 174/250–268; 361/760, 792–795
See application file for complete search history.

(56) References Cited

U.S. PATENT DOCUMENTS 4,442,137 A * 4/1984 Kumar .......................... 427/560
6,486,551 B1 * 11/2002 Sato et al. ..................... 257/737
(Continued)

FOREIGN PATENT DOCUMENTS

JP  2003-023239 A  1/2003
JP  2010-223849 A  10/2010

OTHER PUBLICATIONS

JPO, Notification of Reason for Rejection issued in corresponding Japanese application No. 2012-277275, dispatched Apr. 14, 2015.

*Primary Examiner* — Ishwarbhai B Patel
(74) *Attorney, Agent, or Firm* — Stites & Harbison, PLLC; Jeffrey A. Haeberlin

(57) ABSTRACT

A ceramic substrate is provided that includes a ceramic substrate main body having a principal surface, and a connecting terminal portion disposed on the principal surface of the ceramic substrate main body that is capable of being connected to another component via solder. The connecting terminal portion includes a copper layer and a coating metal layer covering a surface of the copper layer. The ceramic substrate includes a contact layer disposed between the ceramic substrate main body and the copper layer. The contact layer includes one of a nickel-chromium alloy, chromium, molybdenum, and palladium, and is set back from a side surface of the copper layer in a substrate plane direction.

7 Claims, 6 Drawing Sheets

(51) Int. Cl.
    *H05K 3/42*     (2006.01)
    *H05K 3/40*     (2006.01)
    *C23C 28/02*    (2006.01)
    *H05K 3/24*     (2006.01)
    *H05K 3/46*     (2006.01)

(52) U.S. Cl.
    CPC ............... *H05K3/246* (2013.01); *H05K 3/429* (2013.01); *H05K 3/4629* (2013.01)

(56) References Cited

U.S. PATENT DOCUMENTS

| | | | |
|---|---|---|---|
| 6,759,599 B2 * | 7/2004 | Tatoh et al. | 174/261 |
| 2003/0005582 A1 | 1/2003 | Tatoh et al. | |
| 2005/0205293 A1 * | 9/2005 | Yamada et al. | 174/255 |
| 2011/0186336 A1 * | 8/2011 | Nakayama | 174/255 |
| 2014/0166346 A1 * | 6/2014 | Otsuka et al. | 174/255 |

* cited by examiner

CERAMIC SUBSTRATE AND METHOD OF MANUFACTURING THE SAME

CROSS-REFERENCE TO RELATED APPLICATION

This application is based on Japanese Patent Application No. 2012-277275 filed with the Japan Patent Office on Dec. 19, 2012, the entire content of which is hereby incorporated by reference.

BACKGROUND OF THE INVENTION

1. Field of the Invention

The present disclosure relates to a ceramic substrate for mounting a component such as a light-emitting diode and a method of manufacturing the ceramic substrate.

2. Description of Related Art

Light-emitting diodes (LEDs) are well known light-emitting elements. In recent years, a high-brightness blue LED has been put into practical use. The blue LED can be therefore combined with red and green LEDs to obtain high-brightness white light, facilitating the development of a light bulb or an automobile headlight using these three color LEDs. In general, LEDs have the advantage of smaller electric power consumption. Thus, the use of LEDs in headlights can reduce battery load. LEDs also have the advantage of long operating life, thereby being expected to be applied in lighting fixtures, such as fluorescent lamps and light bulbs. For using LEDs in the above applications, high performance of a LED package is an important factor in maximizing the advantages of the LEDs. In this respect, a ceramic package may be suitable for mounting LEDs because of its superior properties such as durability, heat resistance, corrosion resistance, and heat dissipation, compared with, for example, an organic package.

The ceramic package includes a ceramic substrate having an insulator part and a conductor part. The insulator part is made of, for example, an alumina-based ceramic material. The conductor part is made of a metal (such as tungsten or molybdenum) that can be co-fired with alumina. Further, a principal surface of the ceramic substrate has a connecting terminal portion for connection with the LED. The connecting terminal portion includes a copper layer made of copper and a metal layer (such as a nickel layer or a gold layer) covering the copper layer, which are successively stacked by any technique well known in the art (such as a sputtering or plating technique). The copper layer of the connecting terminal portion has poor adhesion property to the ceramic layer. Thus, a contact layer of titanium is formed as an under layer for the copper layer to improve the adhesion property of the connecting terminal portion (see, for example, JP-A-2010-223849).

BRIEF SUMMARY OF THE INVENTION

A ceramic substrate includes a ceramic substrate main body having a principal surface, and a connecting terminal portion disposed on the principal surface of the ceramic substrate main body and capable of being connected to another component via solder. The connecting terminal portion includes a copper layer and a coating metal layer covering a surface of the copper layer. The ceramic substrate includes a contact layer disposed between the ceramic substrate main body and the copper layer. The contact layer includes one of a nickel-chromium alloy, chromium, molybdenum and palladium, and is set back from a side surface of the copper layer in a substrate plane direction.

DETAILED DESCRIPTION OF EXEMPLARY EMBODIMENTS OF THE INVENTION

Figure 1:
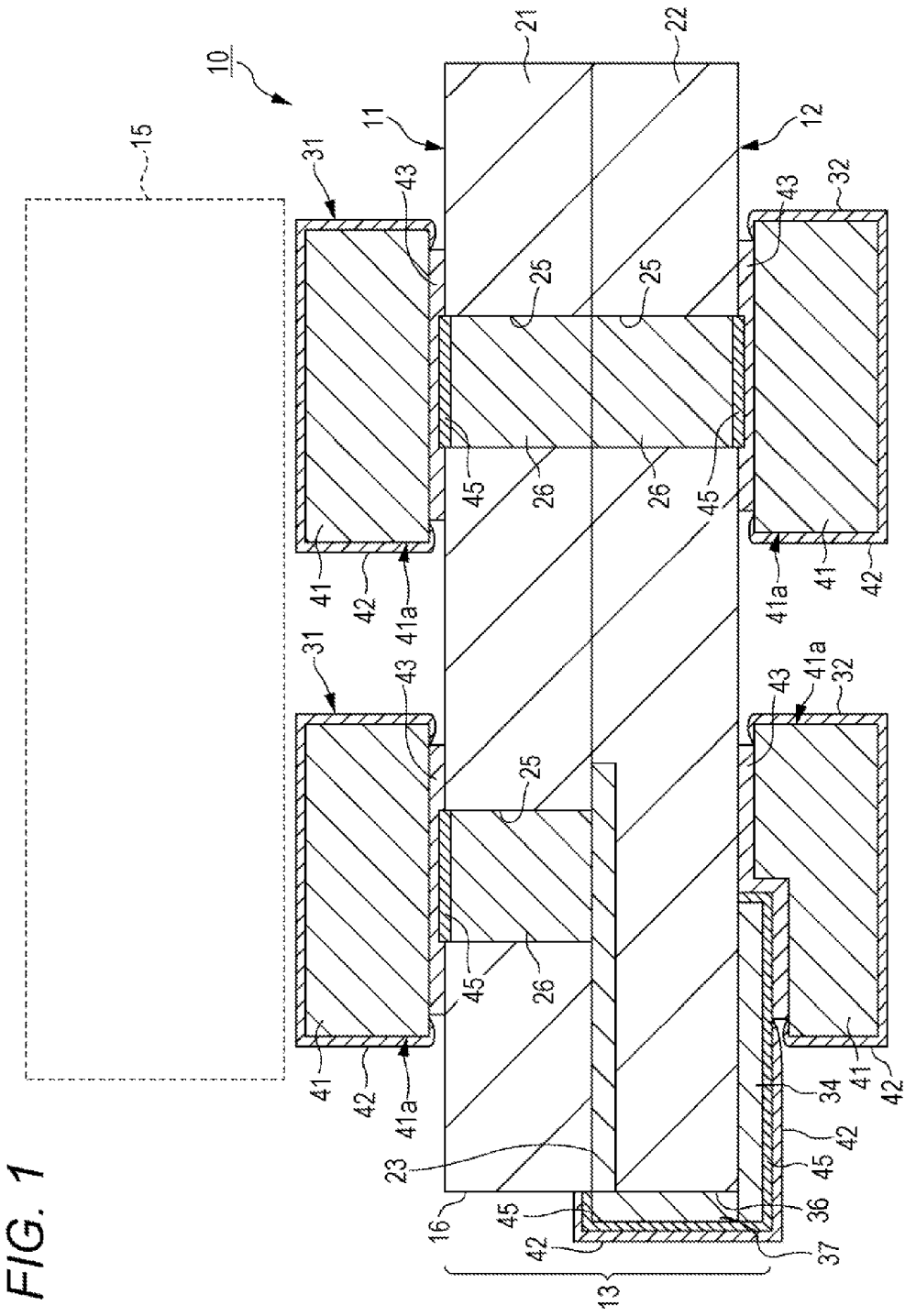
FIG. 1 is a schematic cross-sectional view of a ceramic substrate according to an embodiment.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A ceramic package is formed by, for example, connecting a LED to a connecting terminal portion of a ceramic substrate by soldering. When the package is used in a high-temperature and high-humidity environment (such as at a temperature of 85° C. and a humidity of 85%), a soldering flux composition (active component) makes the package have a corroded interface between a copper layer and a titanium layer, which is in close contact with each other, in a connecting terminal portion thereof. Such corrosion leads to an open failure at the connecting terminal portion.

At the connecting terminal portion of the ceramic package, a component other than the LED, such as an IC chip, may be soldered. In this case, a similar problem of open failure is also caused by corrosion when the ceramic package is used in high-temperature and high-humidity environment.

An object of the present disclosure is to provide a ceramic substrate that can prevent a connecting terminal portion thereof from being corroded, and that has excellent connection reliability. Another object of the present disclosure is to provide a method of manufacturing the ceramic substrate.

A ceramic substrate in an embodiment of the present disclosure (the ceramic substrate) includes a ceramic substrate main body having a principal surface, and a connecting terminal portion disposed on the principal surface of the ceramic substrate main body that can be connected to another component via solder. The connecting terminal portion includes a copper layer and a coating metal layer covering a surface of the copper layer. The ceramic substrate includes a contact layer disposed between the ceramic substrate main body and the copper layer. The contact layer includes one of a nickel-chromium alloy, chromium, molybdenum and palladium, and is set back from a side surface of the copper layer in a substrate plane direction.

In the present ceramic substrate, the contact layer is disposed between the ceramic substrate main body and the copper layer of the connecting terminal portion. Thus, a sufficient contact strength can be ensured between the ceramic substrate main body and the connecting terminal portion. The contact layer of the present ceramic substrate is set back from the side surface of the copper layer in the substrate plane direction. Thus, when the other component is soldered to the connecting terminal portion, the soldering flux composition of the solder tends to easily come into contact with the interface of the contact layer and the copper layer. In the present ceramic substrate, the contact layer contains one of a nickel-chromium (Ni—Cr) alloy, chromium (Cr), molybdenum (Mo), and palladium (Pd). These metals have better corrosion resistance against the soldering flux composition in the solder than titanium (Ti). Accordingly, when another component is soldered to the connecting terminal portion of the present ceramic substrate, corrosion due to the soldering flux composition as would result in the conventional art can be suppressed. As a result, open failure in the connecting terminal portion can be avoided. Further, the connection reliability of the ceramic substrate can be increased. The coating metal layer may contain at least nickel, and may further contain nickel and gold. The coating metal layer may further contain nickel, palladium, and gold.

The ceramic substrate may include a metallized metal layer disposed on the principal surface of the ceramic substrate main body. The metallized metal layer may be coated with a protection layer for protecting from an etching solution for etching the contact layer, and at least a portion of the contact layer may be formed on the protection layer. Moreover, in the ceramic substrate, a part of the metallized metal layer coated with the protection layer may be extended from a projected area of the connecting terminal portion.

At the time of manufacturing the ceramic substrate, the contact layer is formed as an underlayer of the connecting terminal portion through sputtering and etching steps, for example. A part of the metallized metal layer may be extended beyond the projected area of the connecting terminal portion. In this case, the portion of the contact layer extended and exposed from the connecting terminal portion is removed by etching, whereby the contact layer is formed between the copper layer and the ceramic substrate main body. In this case, by coating the metallized metal layer with the protection layer prior to forming the contact layer, corrosion of the metallized metal layer due to the etching solution for the contact layer can be avoided. As a result, the connection reliability of the ceramic substrate can be ensured.

The present ceramic substrate may include an end-face through-hole conductor of a metallized metal disposed on a side surface of the ceramic substrate main body, and a surface of the end-face through-hole conductor may be coated with the protection layer. In this way, too, corrosion of the metallized metal of the end-face through-hole conductor due to the etching solution for the contact layer can be avoided. Thus, the connection reliability of the ceramic substrate can be increased.

Further, in the present ceramic substrate, on the principal surface of the ceramic substrate main body, a wiring conductor portion including the metallized metal layer and connecting the connecting terminal portion with the end-face through-hole conductor may be disposed, and a surface of the wiring conductor portion may also be coated with the protection layer. In this way, too, corrosion of the metallized metal layer of the wiring conductor portion due to the etching solution for the contact layer can be avoided. Thus, the connection reliability of the ceramic substrate can be increased.

In the present ceramic substrate, the contact layer may be set back from the side surface of the copper layer such that a gap is formed between the copper layer and the ceramic substrate main body, and the coating metal layer may be extended into the gap. In this case, a surface of the copper layer can be reliably coated with the coating metal layer. Further, the outer surface of the contact layer is oxidized at the time of manufacturing the present ceramic substrate. Thus, the outer surface of the contact layer is not coated with the coating metal layer, so that the interface of the contact layer and the copper layer tends to be easily corroded. However, in the present ceramic substrate, the corrosion at the interface due to the soldering flux composition can be suppressed. Accordingly, the connection reliability of the ceramic substrate can be ensured.

In the present ceramic substrate, the contact layer has a thickness of 0.05 μm or more and 0.5 μm or less. By thus forming the contact layer with an appropriate thickness, a sufficient adhesion property can be ensured between the contact layer and the copper layer of the connecting terminal portion.

In the present ceramic substrate, the protection layer coating the metallized metal layer has a thickness of 0.8 μm or more and 2.5 μm or less. If the thickness of the protection layer is less than 0.8 μm, protection of the metallized metal layer against the etching solution may become insufficient. If the thickness of the protection layer is more than 2.5 μm, the protection layer may be expanded by sintering and the like, making the connecting terminal portion to be readily peeled. By forming the protection layer with the thickness of 0.8 μm or more and 2.5 μm or less, the above problems can be avoided. As a result, the connection reliability of the ceramic substrate can be ensured.

Specific examples of the protection layer include a nickel-plated layer and a gold plated layer. With the nickel-plated layer or the gold plated layer, a sufficient adhesion property with the metallized metal layer can be ensured, and they are not removed by the etching of the contact layer. Thus, the protection layer including a nickel-plated layer or a gold plated layer can reliably protect the metallized metal layer. When a nickel-plated layer is formed as the protection layer, the material cost can be reduced compared with the gold plated layer. As a result, the manufacturing cost of the ceramic substrate can be decreased.

The ceramic substrate main body may have a multilayer structure. Namely, in the ceramic substrate main body, a plurality of ceramic insulating layers including a ceramic material and a plurality of conductor layers including a metallized metal layer may be stacked. In the ceramic insulating layer, a via conductor including a metallized metal may be formed. The via conductor may be electrically connected to the connecting terminal portion. In this way, in the present ceramic substrate, wiring patterns can be highly integrated. Thus, a plurality of types of components can be mounted on the present ceramic substrate.

For the ceramic insulating layer, a sintered material of high temperature fired ceramics may be preferably used. Examples of the sintered material of high temperature fired ceramics include alumina, aluminum nitride, boron nitride, silicon carbide, and silicon nitride. When alumina is used as the ceramic material for the ceramic insulating layer, a ceramic substrate having excellent product reliability in high-temperature and high-humidity environment can be manufactured.

The metallized metal layer and the via conductor may be formed by applying a conductor paste containing a metal powder by a conventionally known process (such as metallization printing) and then performing firing. When the metallized metal layer, the via conductor, and the ceramic insulating layer are formed by co-firing process, the metal powder in the conductor paste has a higher melting point than the firing temperature of the ceramic insulating layer. For example, when the ceramic insulating layer contains so-called high temperature fired ceramics (such as alumina), nickel (Ni), tungsten (W), molybdenum (Mo), manganese (Mn), or an alloy thereof may be selected as the metal powder in the conductor paste.

Examples of the component soldered to the connecting terminal portion include electronic components such as an LED, a resistor, a capacitor, an inductor, and a semiconductor integrated-circuit element. The present ceramic substrate with the LED connected to the connecting terminal portion is used as a lighting apparatus, such as an outdoor lighting apparatus or an automobile headlight. In this case, the present ceramic substrate is used for a long period in high-temperature and high-humidity environment. Thus, the development of corrosion at the interface of the contact layer and the connecting terminal portion as would occur in the conventional art leads to a decrease in strength at the interface, potentially causing open failure (terminal peeling) and the like. On the other hand, in the present ceramic substrate, the development of corrosion at the interface of the contact layer and the connecting terminal portion can be prevented even in high-temperature and high-humidity environment. Thus, product reliability can be ensured for a long period.

A method of manufacturing the ceramic substrate in an embodiment of the present disclosure includes: a firing step of forming the ceramic substrate main body and the metallized metal layer; a protection layer-forming step of forming the protection layer by performing nickel plating on the metallized metal layer exposed on the principal surface side of the ceramic substrate main body; a contact layer-forming step of forming the contact layer on a surface of the protection layer and on the principal surface of the ceramic substrate main body; a copper layer-forming step of forming the copper layer of the connecting terminal portion on a surface of the contact layer by performing copper plating; an etching step of removing the contact layer exposed on the principal surface side of the ceramic substrate main body by etching while protecting the metallized metal layer from corrosion due to the etching solution with the protection layer; and a coating metal layer-forming step of forming the coating metal layer on the surface of the copper layer by successively plating the surface of the copper layer with nickel and gold or with nickel, palladium, and gold.

According to the present manufacturing method, the protection layer-forming step is performed prior to forming the contact layer in the contact layer-forming step. In this step, the protection layer is formed by performing nickel plating on the metallized metal layer exposed on the principal surface side of the ceramic substrate main body. In the protection layer-forming step, sintering may be performed on the protection layer so as to increase the contact strength between the metallized metal layer and the protection layer. Subsequently, the contact layer-forming step and the copper layer-forming step are performed successively. Thus, the contact layer and the copper layer are formed on the metallized metal layer via the protection layer.

In the etching step, the contact layer is etched to remove a part of the contact layer exposed on the principal surface side of the ceramic substrate main body. As a result, the contact layer remains between the principal surface of the ceramic substrate main body and the copper layer, while a part of the outer surface of the contact layer that is disposed between the principal surface of the ceramic substrate main body and the copper layer is removed by etching. Thus, the contact layer is set back from the side surface of the copper layer in the substrate plane direction. In addition, the protection layer protects the surface of the metallized metal layer. Thus, the protection layer prevents the etching solution from causing corrosion of the metallized metal layer in the etching step. Subsequently, in the coating metal layer-forming step, the coating metal layer is formed on the surface of the copper layer. Thus, the connecting terminal portion including the copper layer and the coating metal layer is formed.

Thus, in the present ceramic substrate, the contact layer is formed between the principal surface of the ceramic substrate main body and the copper layer of the connecting terminal portion. The contact layer contains one of a nickel-chromium alloy, chromium, molybdenum, and palladium. The contact layer has better corrosion resistance against the soldering flux composition than titanium. Accordingly, when the other component is soldered to the connecting terminal portion, corrosion due to the soldering flux composition as would be caused in the contact layer of titanium according to the conventional art can be suppressed. As a result, open failure in the connecting terminal portion can be avoided, whereby the connection reliability of the ceramic substrate can be increased.

In the following, a ceramic substrate according to an embodiment of the present disclosure will be described with reference to the drawings.

As illustrated in FIG. 1, a ceramic substrate 10 according to the present embodiment includes a ceramic substrate main body 13 in the form of a rectangular plate. The ceramic substrate main body 13 has principal surfaces that include a substrate front surface 11 and a substrate rear surface 12. On the substrate front surface 11 side, an LED 15 is mounted. The ceramic substrate main body 13 has a multilayer structure. Namely, the ceramic substrate main body 13 includes two ceramic insulating layers 21 and 22 and a conductor layer 23, which are stacked on one another. The insulating layers 21 and 22 each contain a ceramic material, and the conductor layer 23 includes a metallized metal layer. The ceramic insulating layers 21 and 22 are sintered materials each containing alumina as a ceramic material. The conductor layer 23 includes, for example, tungsten, molybdenum, or an alloy thereof.

The ceramic insulating layers 21 and 22 of the ceramic substrate main body 13 have via holes 25 extending in a thickness direction. Via conductors 26 are formed in the respective via holes 25. The via conductor 26 includes, for example, a metallized metal of tungsten, molybdenum, or an alloy thereof.

The ceramic substrate 10 further includes two front surface-side terminal portions 31 (connecting terminal portions) disposed on the substrate front surface 11 side of the ceramic substrate main body 13 thereof. The front surface-side terminal portions 31 are connected to the LED 15 (other component). Specifically, the front surface-side terminal portions 31 are disposed immediately above the via conductors 26, respectively. In other words, the front surface-side terminal portions 31 are disposed on the surface of the upper ends of the via conductors 26, and are electrically connected to the via conductors 26, respectively. Each front surface-side terminal portion 31 has a width greater than the diameter of the corresponding via conductor 26. The front surface-side terminal portions 31 are formed to entirely cover the upper ends of the via conductors 26, respectively.

The ceramic substrate main body 13 further includes two rear surface-side terminal portions 32 (connecting terminal portions) on the rear surface 12 side thereof. The rear surface-side terminal portions 32 are connected to an external substrate (another component) (not shown). One of the rear surface-side terminal portions 32 (in FIG. 1, the right side terminal portion) is disposed on the surface of the lower end of the corresponding via conductor 26 to make an electrical connection therebetween. The other of the rear surface-side terminal portions 32 (in FIG. 1, the left side terminal portion) is connected not to the via conductors 26 but to a wiring conductor portion 34 (conductor layer) disposed on the substrate rear surface 12. Like the conductor layer 23, the wiring conductor portion 34 includes a metallized metal layer of tungsten, molybdenum, or an alloy thereof.

The ceramic substrate main body 13 includes a side surface 16 in which a recessed portion 36 with semi-circular cross section is formed. On the surface of the recessed portion 36, a castellation 37 (end-face through-hole conductor) is disposed. Like the via conductors 26, the castellation 37 includes a metallized metal of tungsten, molybdenum, or an alloy thereof. The castellation 37 is connected to the wiring conductor portion 34 on the substrate rear surface 12. The castellation 37 is also connected to a conductor layer 23 disposed between the ceramic insulating layer 21 and the ceramic insulating layer 22. The conductor layer 23 is connected to the front surface-side terminal portion 31 via the via conductor 26.

Figure 2:
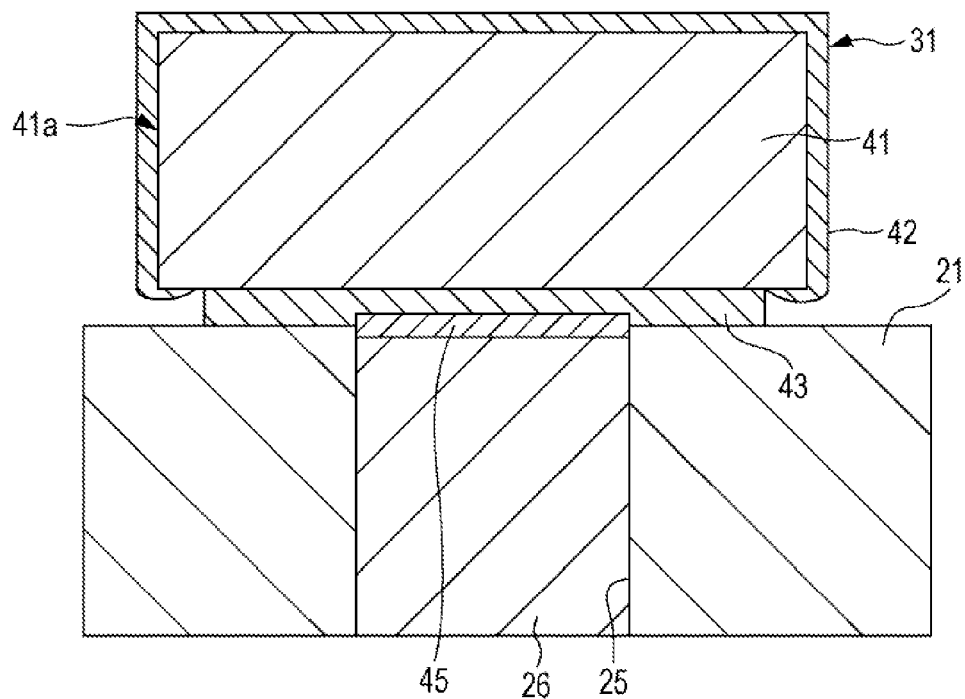
FIG. 2 is an enlarged cross-sectional view of a front surface-side terminal portion.

As illustrated in FIGS. 1 and 2, the front surface-side terminal portion 31 includes a copper layer 41 and a coating metal layer 42 that covers the surface of the copper layer 41. The copper layer 41 of the front surface-side terminal portions 31 includes a copper plated layer. The coating metal layer 42 includes a nickel-plated layer and a gold plated layer. Between the ceramic substrate main body 13 and the copper layer 41 of the front surface-side terminal portions 31, a contact layer 43 including molybdenum is disposed. The contact layer 43 is a metal layer with an adhesion property superior to that of the copper layer 41 with respect to the ceramic substrate main body 13 (ceramic insulating layers 21 and 22). The contact layer 43 may include one of a nickel-chromium alloy, chromium, and palladium, other than molybdenum. The contact layer 43 has a thickness of 0.05 µm or more and 0.5 µm or less. The contact layer 43 is formed by a process conventionally known, such as sputtering or CVD.

According to the present embodiment, the contact layer 43 is set back from the side surface 41a of the copper layer 41 of the front surface-side terminal portions 31 in a substrate plane direction. The contact layer 43 is set back from the side surface 41a of the copper layer 41. Thus, a gap is formed between the copper layer 41 and the substrate front surface 11. The coating metal layer 42 extends into the gap. The outer surface of the contact layer 43 is oxidized and therefore is not covered with the coating metal layer 42. Further, according to the present embodiment, a nickel-plated layer 45 is disposed between the contact layer 43 and the metallized metal of the via conductors 26. The nickel-plated layer 45 has a thickness of 0.8 µm or more and 2.5 µm or less, for example.

As descried above, the rear surface-side terminal portions 32 is formed on the substrate rear surface 12 of the ceramic substrate main body 13. The rear surface-side terminal portions 32 have a layer structure similar to the layer structure of the front surface-side terminal portions 31. Namely, the rear surface-side terminal portions 32 include the copper layer 41 and the coating metal layer 42 covering the surface of the copper layer 41. The contact layer 43 including molybdenum is disposed between the ceramic substrate main body 13 and the copper layer 41 of the rear surface-side terminal portions 32. The contact layer 43 is set back from the side surface 41a of the copper layer 41 of the rear surface-side terminal portions 32 in the substrate plane direction. The contact layer 43 is set back from the side surface 41a of the copper layer 41. Thus, a gap is formed between the copper layer 41 and the substrate rear surface 12. The coating metal layer 42 extends into the gap. The outer surface of the contact layer 43 is oxidized and therefore is not coated with the coating metal layer 42. The nickel-plated layer 45 is disposed between the contact layer 43 and the metallized metal of the via conductor 26.

Figure 3:
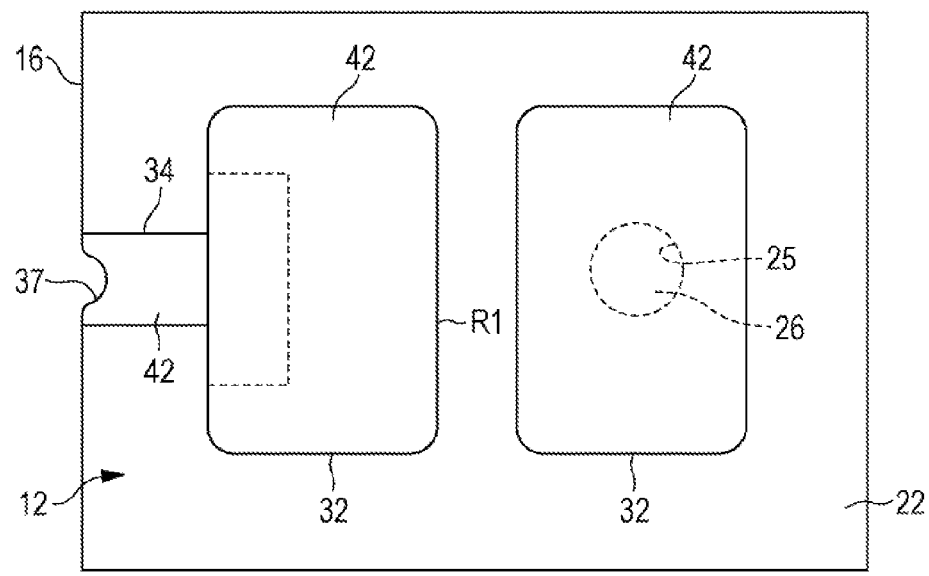
FIG. 3 is a planar view of a rear surface-side terminal portion of a substrate viewed from a rear surface side thereof.

On the substrate rear surface 12 of the ceramic substrate main body 13, the surface of the metallized metal layer of the wiring conductor portion 34 is coated with the nickel-plated layer 45. The nickel-plated layer 45 is a protection layer for protecting the wiring conductor portion 34 from etching solution with which the contact layer 43 is etched. According to the present embodiment, a part of the wiring conductor portion 34 (metallized metal layer) coated with the nickel-plated layer 45 extends beyond a projected area R1 of the rear surface-side terminal portion 32 (see FIG. 3). In FIG. 3, the area inside the outline of the rear surface-side terminal portion 32 constitutes the projected area R1 of the rear surface-side terminal portion 32. As illustrated in FIG. 1, the nickel-plated layer 45 is also disposed between the metallized metal layer of the wiring conductor portion 34 and the contact layer 43 at the rear surface-side terminal portion 32 connected to the wiring conductor portion 34.

The surface of the metallized metal of the castellation 37 formed on the side surface 16 of the ceramic substrate main body 13 is also covered with the nickel-plated layer 45 (protection layer). Further, a surface of the nickel-plated layer 45 (protection layer) that is on the surface of the wiring conductor portion 34 exposed from the rear surface-side terminal portion 32 and on the surface of the castellation 37 is coated with the coating metal layer 42 (nickel-plated layer and gold plated layer).

A method of manufacturing the ceramic substrate 10 according to the present embodiment will be described. The ceramic substrate 10 according to the present embodiment is manufactured by a multi-piece process.

First, an alumina powder as ceramic material, an organic binder, a solvent, a plasticizer and the like are mixed to prepare slurry. The slurry is formed into a sheet by a process conventionally known (such as doctor blade method or calendar roll method). In this way, two ceramic green sheets are prepared.

Figure 4:
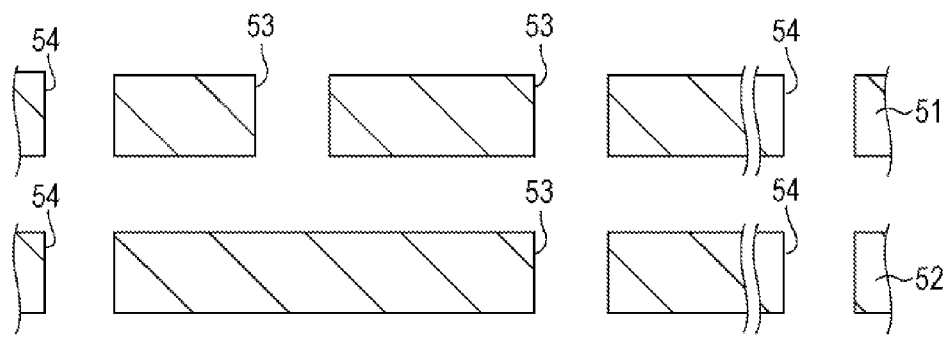
FIG. 4 is a diagram illustrating a step of forming a through-hole.

Then, through-holes 53 and 54 are formed at a plurality of locations in the ceramic green sheets 51 and 52 by punching (see FIG. 4). The through-holes 53 and 54 penetrate the ceramic green sheets 51 and 52 in their thickness direction. The through-holes 53 and 54 may be formed by a process other than punching, such as laser drilling.

The through-holes 53 in the ceramic green sheets 51 and 52 are hole portions for forming the via conductors 26. The through-holes 54 are hole portions for forming the castellation 37. Namely, after ceramic firing, the through-holes 53 form the via holes 25, and a part of the through-holes 54 forms the recessed portion 36.

Figure 5:
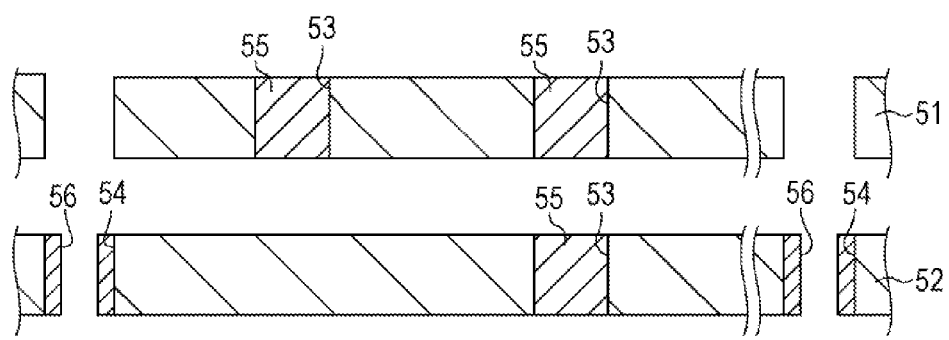
FIG. 5 is a diagram illustrating a step of forming a via conductor and a castellation.

Conductor portions are formed in the through-holes 53 and 54, respectively. More specifically, the through-holes 53 are initially filled with an electrically conductive paste containing tungsten or molybdenum by using a conventionally known paste printing apparatus. Thus, un-fired via conductor portions 55 to be formed into the via conductors 26 are formed (see FIG. 5). Namely, the un-fired via conductor portions 55 are formed by completely filling the through-holes with the electrically conductive paste. Then, castellation printing is performed to attach the electrically conductive paste containing tungsten or molybdenum onto the inner peripheral surfaces of the through-holes 54. Thus, conductor portions 56 for the un-fired castellation to be formed into the castellation 37 are formed (see FIG. 5). The through-holes 54 may not be completely filled with the electrically conductive paste. The center of the conductor portions 56 for un-fired castellation is hollowed. The castellation printing may be performed after the un-fired via conductor portions 55 are formed as described above. Alternatively, the un-fired via conductor portions 55 may be formed after the castellation printing.

Figure 6:
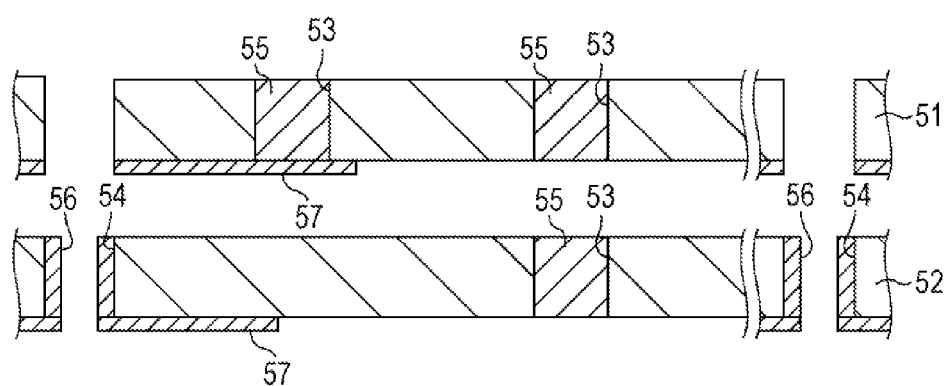
FIG. 6 is a diagram illustrating a step of forming a conductor layer and a wiring conductor portion.

Then, un-fired conductor portions 57 are formed on the ceramic green sheets 51 and 52 by screen-printing (see FIG. 6). Here, an electrically conductive paste is printed on surfaces (lower surfaces in FIG. 6) of the ceramic green sheets 51 and 52 by using a mask (not illustrated). In this way, the un-fired conductor portions 57 are patterned. The un-fired conductor portions 57 are later formed into the conductor layer 23 and the wiring conductor portion 34. Subsequently, the ceramic green sheets 51 and 52 are heated to a predetermined temperature, whereby the un-fired conductor portions 55, 56, and 57 formed on the ceramic green sheets 51 and 52 are dried.

The ceramic green sheet 51 and the ceramic green sheet 52 are then laminated, and a predetermined load is applied to the resultant laminated body in a thickness direction by using a conventionally known laminating apparatus, whereby the ceramic green sheets 51 and 52 are compressed and integrated. Thus, an un-fired ceramic laminated body is formed.

Figure 7:
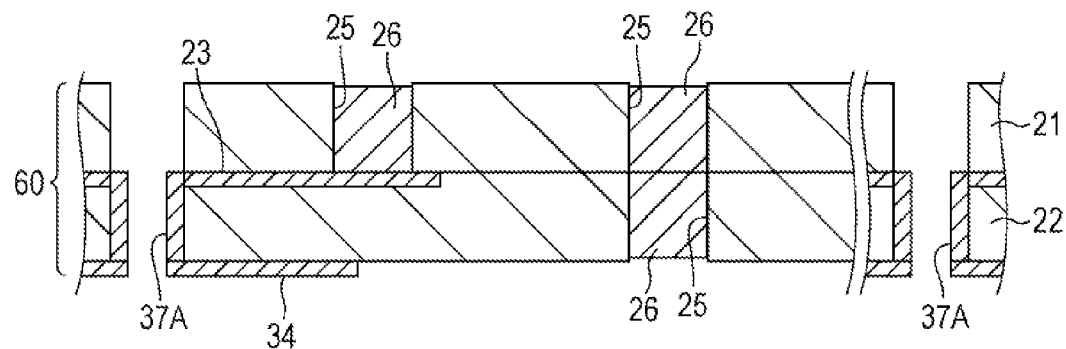
FIG. 7 is a diagram illustrating a step of firing a ceramic substrate main body.

Subsequently, the un-fired ceramic laminated body is heated to a predetermined temperature (such as approximately 1500° C. to 1800° C.) such that the alumina can be sintered (firing step). Through the firing step, the ceramic green sheets 51 and 52 are sintered. As a result, a ceramic substrate main body 60 including the integrated ceramic insulating layers 21 and 22 is obtained (see FIG. 7). At the same time, the metallized metal layer of the conductor layer 23 and the wiring conductor portion 34, and the metallized metal of the via conductors 26 and the through-hole conductors 37A are formed by the sintering of the electrically conductive paste.

Figure 8:
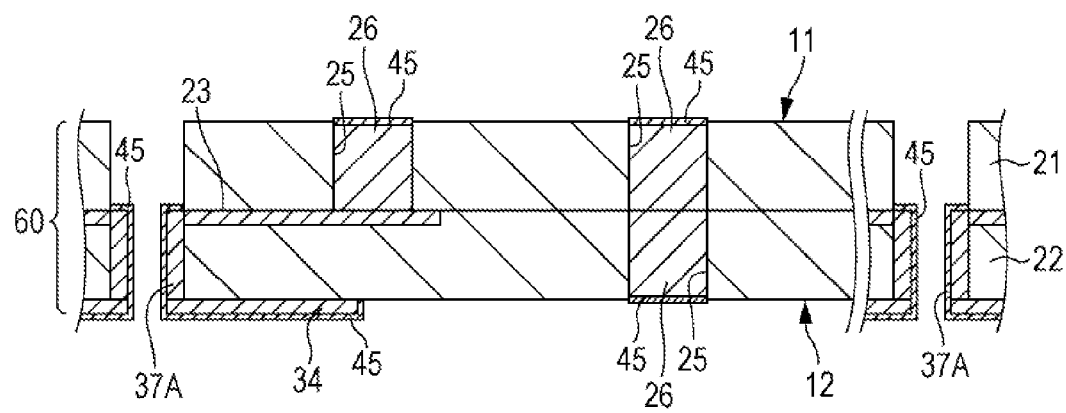
FIG. 8 is a diagram illustrating a step of forming a protection layer.

Next, nickel electroplating is performed in a protection layer-forming step. As a result, in the ceramic substrate main body 60, a nickel-plated layer 45 is formed on the surface of the metallized metal layer of the wiring conductor portion 34, and on the surface of the metallized metal of the via conductors 26 and the through-hole conductors 37A (see FIG. 8). The resulting nickel-plated layer 45 has a thickness of 0.8 μm or more and 2.5 μm or less. Subsequently, the ceramic substrate main body 60 is heated to a temperature of approximately 850° C. to sinter the nickel-plated layer 45.

Figure 9:
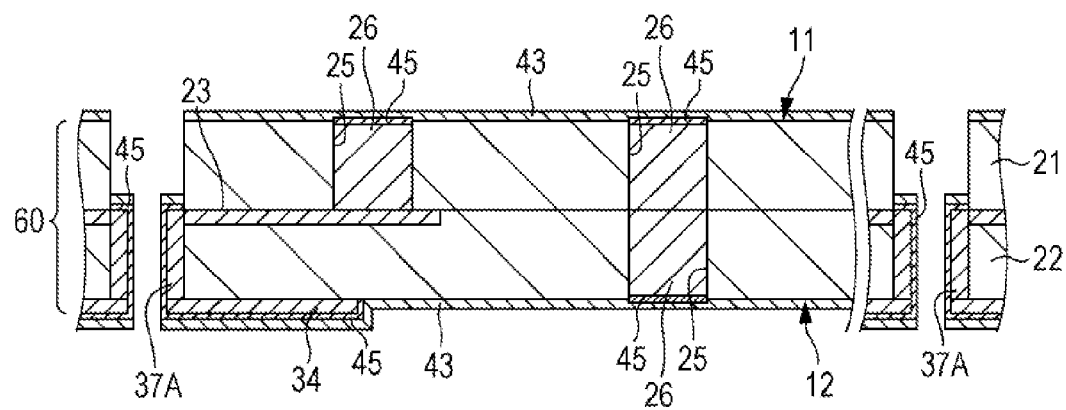
FIG. 9 is a diagram illustrating a step of forming a contact layer.

Next, as illustrated in FIG. 9, molybdenum sputtering is performed to form the contact layer 43 on the surface of the nickel-plated layer 45 and the substrate front surface 11 and the substrate rear surface 12 of the ceramic substrate main body 60 (contact layer-forming step). The resulting contact layer 43 has a thickness of 0.05 μm or more and 0.5 μm or less.

Further, copper sputtering is performed to form a copper sputtered layer (not illustrated) on the surface of the contact layer 43.

Figure 10:
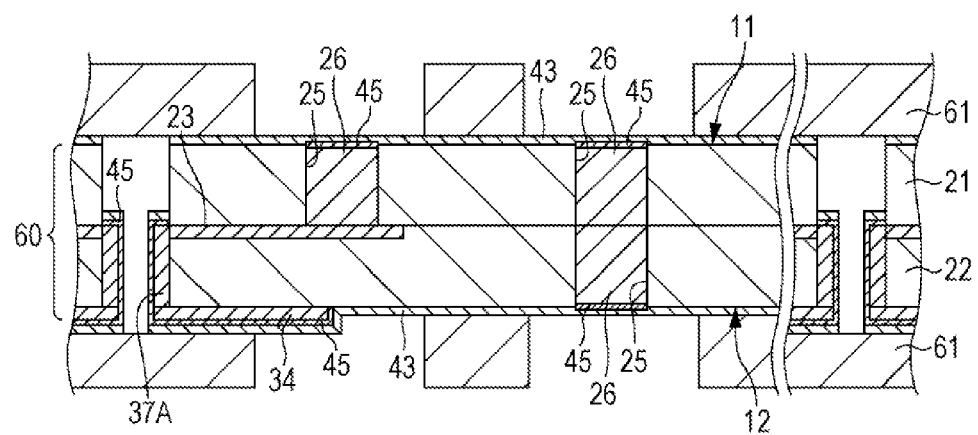
FIG. 10 is a diagram illustrating a step of forming a plating resist.
Figure 11:
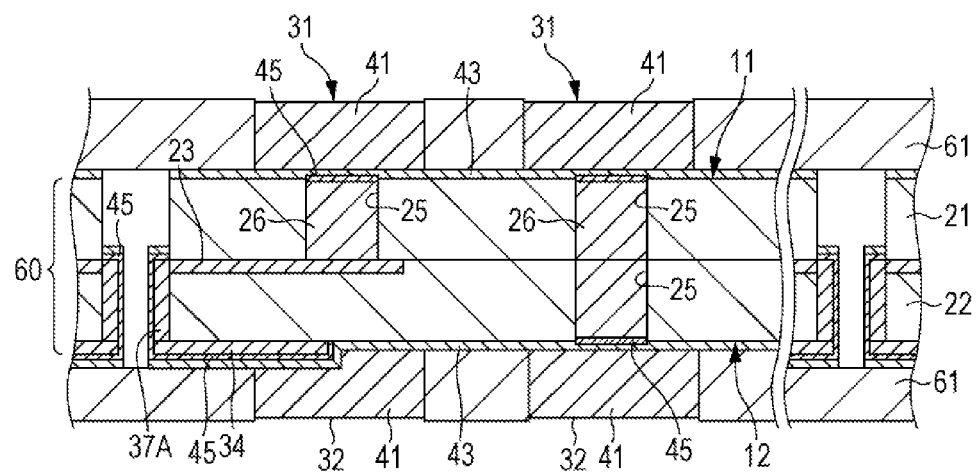
FIG. 11 is a diagram illustrating a step of forming a copper layer.

Subsequently, a copper layer-forming step is performed. Specifically, a photosensitive plating resist material is applied onto the substrate front surface 11 and the substrate rear surface 12 of the ceramic substrate main body 60. On the plating resist material, an exposing mask with a predetermined mask pattern is disposed, and the plating resist material is exposed via the exposing mask. The exposed plating resist material is then developed to form a plating resist 61 (see FIG. 10). Then, copper electroplating is performed to form the copper layer 41 for the front surface-side terminal portions 31 and the rear surface-side terminal portions 32 on the surface of the contact layer 43 (see FIG. 11).

Figure 12:
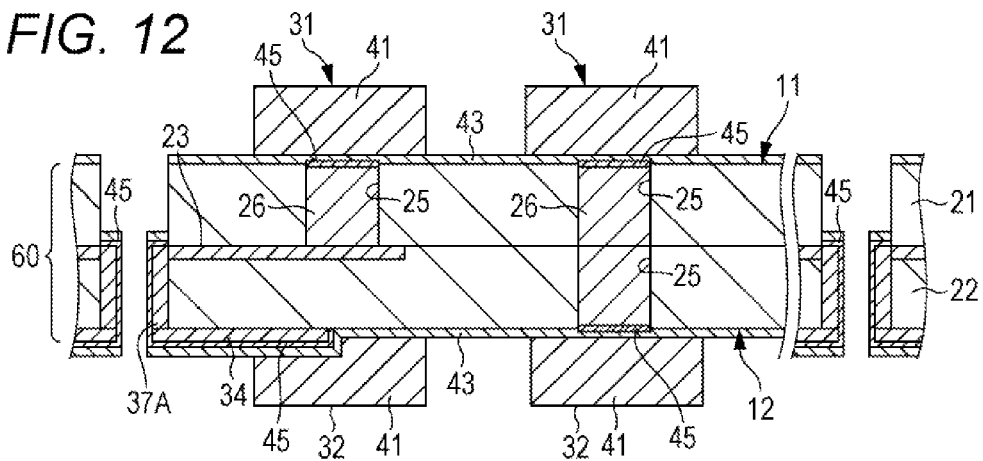
FIG. 12 is a diagram illustrating a step of peeling a plating resist.
Figure 13:
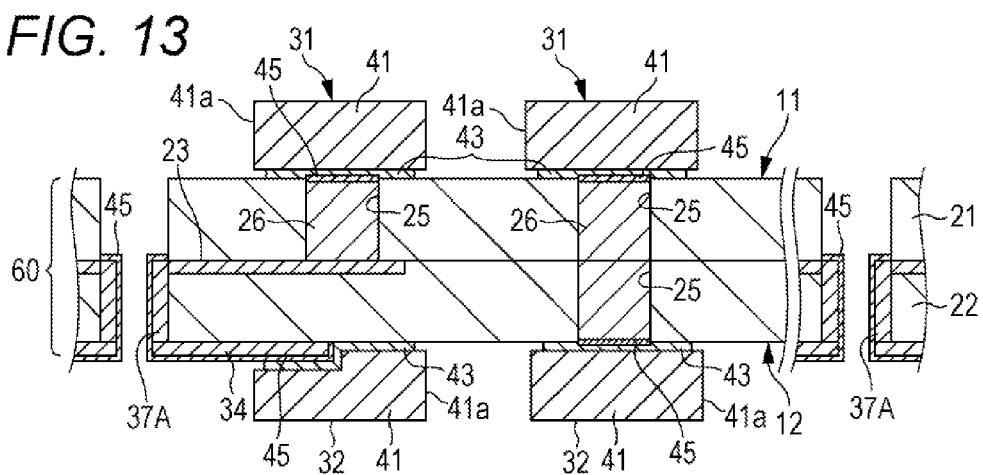
FIG. 13 is a diagram illustrating a step of etching a contact layer.

Then, surface-conditioning polishing is performed to grind the surface of the plating resist 61 and the end face of the copper layer 41, whereby the height of each copper layer 41 is adjusted to a predetermined height (such as on the order of 100 μm). Then, the plating resist 61 on the substrate front surface 11 and on the substrate rear surface 12 is peeled by contacting a peeling solution (see FIG. 12). Subsequently, copper etching is performed to remove the copper sputtered layer (not illustrated) exposed on the substrate front surface 11 and the substrate rear surface 12. Further, as illustrated in FIG. 13, molybdenum etching is performed to remove the contact layer 43 exposed on the substrate front surface 11 and the substrate rear surface 12 (etching step). At this time, the nickel-plated layer 45 formed on the surface of the metallized metal layer of the wiring conductor portion 34 and on the surface of the metallized metal of the through-hole conductors 37A functions as a protection layer against the etching solution for the contact layer 43. Thus, the etching solution can be prevented from causing corrosion of the metallized metal layer of the wiring conductor portion 34 and corrosion of the metallized metal of the through-hole conductors 37A.

In the contact layer 43 etching step, the outer surface of the contact layer 43 disposed between the principal surfaces of the ceramic substrate main body 60 (the substrate front surface 11 and the substrate rear surface 12) and the copper layer 41 is partially removed by etching. Thus, the contact layer 43 is set back from the side surface 41a of the copper layer 41 in a substrate plane direction.

Next, the ceramic substrate main body is heated to a temperature of 500° C. (heating process). This heating process enhances the adhesion property between the contact layer 43 and the nickel-plated layer 45. In addition, this heating process enhances the adhesion property between the copper layer 41 and the contact layer 43.

Figure 14:
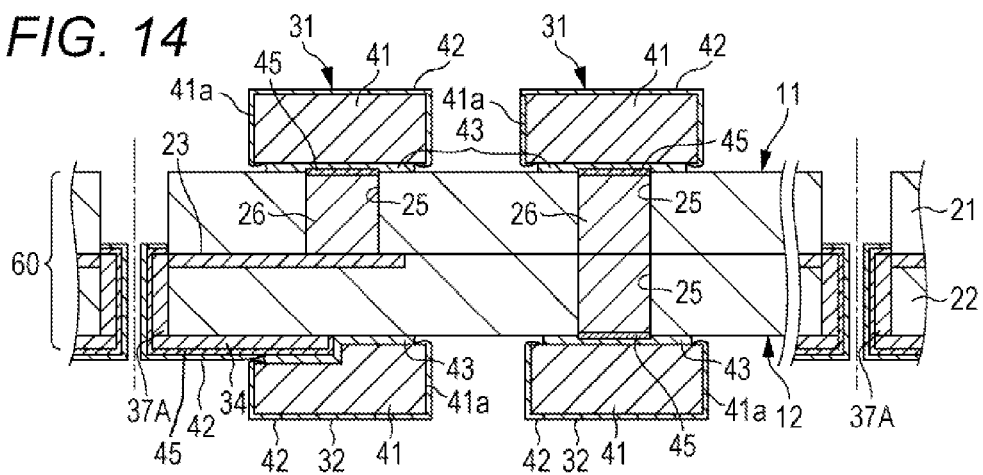
FIG. 14 is a diagram illustrating a step of forming a coating metal layer.

Next, as illustrated in FIG. 14, a coating metal layer-forming step is performed. In the coating metal layer-forming step, nickel plating and gold plating (specifically, nickel electroplating and gold electroplating) are successively performed on the surfaces of the copper layer 41 on the front surface-side terminal portions 31 and on the rear surface-side terminal portions 32, and on the surfaces of the metallized metal layer of the wiring conductor portion 34 and the metallized metal of the through-hole conductors 37A. Thus, the coating metal layer 42 is formed on these surfaces.

The ceramic substrate main body 60 obtained through the above steps is a multi-piece substrate including a plurality of product areas arranged vertically and horizontally along the planar direction. The multi-piece substrate main body 60 is divided in a dividing step, whereby a plurality of the ceramic substrates 10 illustrated in FIG. 1 can be simultaneously obtained. Further, in the dividing step, the ceramic substrate main body 60 is divided at the positions of the through-hole conductors 37A (positions indicated by dashed lines in FIG. 14). In this way, the castellation 37 (end-face through-hole conductor) exposed on the side surface 16 is formed.

The inventors performed a product reliability evaluation test on the ceramic substrate 10 manufactured by the above manufacturing method. Specifically, the rate of change of electric resistance and the adhesion property of the connecting terminal portion (front surface-side terminal portions 31) in a high temperature (85° C.) and high humidity (85%) environment were evaluated. The evaluation results are shown in Tables 1 and 2 below.

In the evaluation test, the first to the fourth examples of the ceramic substrate 10 were fabricated while varying the forming material of the contact layer 43. In the first example, the contact layer 43 was formed by sputtering a nickel-chromium (Ni—Cr) alloy. In the second example, the contact layer 43 was formed by sputtering chromium (Cr). In the third example, the contact layer 43 was formed by sputtering palladium (Pd). In the fourth example, the contact layer 43 was formed by sputtering molybdenum (Mo). Further, the ceramic substrate according to a first conventional example was prepared and subjected to the evaluation test. In the first conventional example, the contact layer was formed by sputtering titanium (Ti).

The evaluation test of the rate of change of electric resistance was performed as follows: The rear surface-side terminal portions 32 of the ceramic substrate 10 were surface-mounted on a resin circuit substrate (PCB) via solder. The front surface-side terminal portions 31 of the ceramic substrate 10 were electrically connected (short-circuited) by a copper wire and the like. Further, in the resin circuit substrate, copper wires were connected to connecting terminals connected to the rear surface-side terminal portions 32 via a wiring pattern.

Subsequently, the ceramic substrate 10 mounted on the resin circuit substrate was placed in an environmental testing apparatus (the high-temperature/high-humidity testing apparatus PL-1 KP from Espec Corp.). The copper wires connected to the resin circuit substrate were drawn outside the testing apparatus external, and a four-terminal measuring apparatus (the 3227 mΩ Hitester from Hioki E.E. Corporation) was connected to the copper wires drawn outside the testing apparatus. With the measuring apparatus, the resistance value of the ceramic substrate 10 was measured. During the measurement of the resistance change rate in the evaluation test, the resistance value of the ceramic substrate 10 was measured after 500, 750, and 1000 hours of processing time of the high-temperature/high-humidity test following the start of operation of the environmental testing apparatus. The resistance change rate is the rate of change from the initial resistance value at the start of testing and is calculated by the following calculation formula.

Resistance change rate (%)=100×(measured value−initial resistance value)/initial resistance value

TABLE 1

| | Contact layer | Processing time (hours) | | | |
|---|---|---|---|---|---|
| | | 0 | 500 | 750 | 1000 |
| First conventional example | Ti | 0% | 0% | +50% | +100% |
| First example | NiCr | 0% | 0% | 0% | 0% |
| Second example | Cr | 0% | 0% | 0% | 0% |
| Third example | Pd | 0% | 0% | 0% | 0% |
| Fourth example | Mo | 0% | 0% | 0% | 0% |

As shown in Table 1, in the ceramic substrate according to the first conventional example with the contact layer containing titanium, the resistance value was increased after 750 hours of processing time of the high-temperature/high-humidity test, where the resistance change rate was 50%. Further, in the first conventional example, the resistance change rate became 100% (open failure) after 1000 hours of processing time of the high-temperature/high-humidity test. On the other hand, in the ceramic substrate 10 according to the first to the fourth examples, the resistance change rate remained at 0% even after 1000 hours of the high-temperature/high-humidity test, and no deterioration in electric characteristics was observed.

The evaluation test for the adhesion property of the connecting terminal portion was conducted as follows: To the front surface-side terminal portions 31 of the ceramic substrate 10, a flux material (such as ES-1061SP-2 from Senju Metal Industry Co., Ltd.) was applied. Then, the ceramic substrate 10 was placed in the environmental testing apparatus. The ceramic substrate 10 was taken out of the environmental testing apparatus after the elapse of predetermined times (500, 750, 1000, and 1500 hours) in the high-temperature and high-humidity environment, and the failure mode was confirmed by a shear test. In the shear test, by using a shear tester (shear measuring device: the die shear tester Dage Series 4000 from Arctec), the front surface-side terminal portions 31 were caused to fracture, and the fractured surface was analyzed. The failure mode includes interface failure and substrate failure. The interface failure is a failure of the front surface-side terminal portions 31 at the interface between the copper layer 41 of the front surface-side terminal portions 31 and the contact layer 43. The substrate failure is a failure of the front surface-side terminal portions 31 at the ceramic portion inside the ceramic insulating layer 21. The testing results for the respective ceramic substrates 10 are shown in Table 2.

TABLE 2

| | Contact layer | Processing time (hours) | | | | |
|---|---|---|---|---|---|---|
| | | 0 | 500 | 750 | 1000 | 1500 |
| First conventional example | Ti | Substrate failure | Interface failure | Interface failure | Interface failure | Interface failure |
| First example | NiCr | ↑ | Substrate failure | Substrate failure | Interface failure | Interface failure |
| Second example | Cr | ↑ | ↑ | Interface failure | Interface failure | Interface failure |

TABLE 2-continued

| | Contact layer | Processing time (hours) | | | | |
|---|---|---|---|---|---|---|
| | | 0 | 500 | 750 | 1000 | 1500 |
| Third example | Pd | ↑ | ↑ | Substrate failure | Substrate failure | Interface failure |
| Fourth example | Mo | ↑ | ↑ | ↑ | ↑ | Substrate failure |

As shown in Table 2, according to the first conventional example, when the high-temperature/high-humidity test was conducted for 500 hours, the adhesion property between the copper layer 41 and the contact layer 43 deteriorated, and failure occurred at the interface of the copper layer 41 and the contact layer 43. On the other hand, according to the first to the fourth examples, in the 500 hours of the high-temperature/high-humidity test, no failure was caused at the interface of the copper layer 41 and the contact layer 43. Thus, an improvement in the adhesion property between the copper layer 41 and the contact layer 43 was confirmed. In particular, in the fourth example in which the contact layer 43 was formed by molybdenum, no failure occurred at the interface of the copper layer 41 and the contact layer 43 even after 1500 hours of the high-temperature/high-humidity test. Namely, it was confirmed that the adhesion property of the contact layer 43 was increased even more in the fourth example.

Thus, according to the present embodiment, the following effects can be obtained.

(1) In the ceramic substrate 10 according to the present embodiment, the contact layer 43 is disposed between the ceramic substrate main body 13 and the copper layer 41 of the front surface-side terminal portions 31 and the rear surface-side terminal portions 32. The contact layer contains one of a nickel-chromium (Ni—Cr) alloy, chromium (Cr), molybdenum (Mo), and palladium (Pd). Thus, the contact strength between the ceramic substrate main body 13 and the terminal portions 31 and 32 can be sufficiently ensured. Further, these metals contained in the contact layer 43 have better corrosion resistance against the soldering flux composition in solder than titanium (Ti). Then, corrosion of the terminal portions 31 and 32 due to the soldering flux composition can be suppressed in the case of soldering the LED 15 to the front surface-side terminal portions 31 and in the case of soldering an external substrate to the rear surface-side terminal portions 32 soldering flux composition. Consequently, open failure in the terminal portions 31 and 32 can be avoided, and the connection reliability of the ceramic substrate 10 can be increased.

(2) In the ceramic substrate 10 according to the present embodiment, the metallized metal layer of the wiring conductor portion 34 is coated with the nickel-plated layer 45. A part of the wiring conductor portion 34 (metallized metal layer) is extended beyond the projected area R1 of the rear surface-side terminal portions 32. Further, the metallized metal of the castellation 37 is also coated with the nickel-plated layer 45. The nickel-plated layer 45 functions as a protection layer against the etching solution for the contact layer 43. Thus, the etching solution can be prevented from causing corrosion of the metallized metal layer of the wiring conductor portion 34 and corrosion of the metallized metal of the castellation 37. As a result, the connection reliability of the ceramic substrate 10 can be ensured.

(3) In the ceramic substrate 10 according to the present embodiment, the contact layer 43 is set back from the side surface 41a of the copper layer 41. The coating metal layer 42 extends into the gap at this portion. Thus, the surface of the copper layer 41 can be reliably coated with the coating metal layer 42.

(4) In the ceramic substrate 10 according to the present embodiment, the thickness of the contact layer 43 is set to be 0.05 μm or more and 0.5 μm or less, for example. By thus forming the contact layer 43 with an appropriate thickness, the adhesion property between the contact layer 43 and the copper layer 41 can be sufficiently ensured. The thickness of the nickel-plated layer 45 is set to be 0.8 μm or more and 2.5 μm or less, for example. By forming the nickel-plated layer 45, the metallized metal layer of the wiring conductor portion 34 and the metallized metal of the castellation 37 can be reliably protected from the etching solution for the contact layer 43. Thus, the connection reliability of the ceramic substrate 10 can be ensured.

(5) In the ceramic substrate 10 according to the present embodiment, the LED 15 is surface-mounted on the front surface-side terminal portions 31 via solder. The ceramic substrate 10 is used for a long period in a high-temperature and high-humidity environment, and yet in the ceramic substrate 10, the progress of corrosion at the interface of the copper layer 41 and the contact layer 43 can be prevented. Thus, the product reliability can be ensured.

The embodiment of the present disclosure may be modified as follows:

The ceramic substrate 10 according to the foregoing embodiment may be configured to mount a chip component other than the LED 15. For example, in the ceramic substrate 10, a through-hole is formed in the ceramic insulating layer 21 disposed on the upper side, and the bottom of the through-hole is closed by the ceramic insulating layer 22 disposed on the lower side, whereby a cavity (housing recessed portion) is formed. In the cavity, a chip such as a surge-resistant chip (chip component for surge voltage protection) may be housed.

In the ceramic substrate 10, a connecting terminal portion for mounting the surge-resistant chip may be formed at the bottom of the cavity. Further, a wiring pattern and/or a via conductor for connecting the connecting terminal portion with the LED-mounting connecting terminal portion may be formed in the ceramic insulating layers 21 and 22. In the ceramic substrate 10, like the LED-mounting connecting terminal portion, the connecting terminal portion for mounting the surge-resistant chip also has a layered structure including the contact layer 43. Thus, the connection reliability can be increased.

In the ceramic substrate 10 according to the present embodiment, the castellation 37 is disposed on the side surface 16 of the ceramic substrate main body 13. However, the ceramic substrate according to the present disclosure may not include the castellation 37. The ceramic substrate 10 includes the two ceramic insulating layers 21 and 22. The ceramic substrate according to the present disclosure may include a multilayered wiring substrate with three or more ceramic insulating layers.

Technical concepts that may be grasped from the foregoing embodiments are listed below.

(1) A ceramic substrate in an embodiment of the present disclosure (the ceramic substrate) includes a ceramic substrate main body having a principal surface, and a connecting terminal portion disposed on the principal surface of the ceramic substrate main body that is capable of being connected to another component via solder. The connecting terminal portion includes a copper layer and a coating metal layer covering a surface of the copper layer. The ceramic substrate includes a contact layer disposed between the ceramic substrate main body and the copper layer. The contact layer includes one of a nickel-chromium alloy, chromium, molybdenum and palladium, and is set back from a side surface of the copper layer in a substrate plane direction.

In the present ceramic substrate, on the principal surface of the ceramic substrate main body, a wiring conductor portion including a metallized metal layer and connecting the connecting terminal portion and an end-face through-hole conductor may be disposed. The metallized metal layer may be coated with a protection layer. The protection layer protects the metallized metal layer from an etching solution for etching the contact layer.

(2) In present ceramic substrate, the contact layer may be set back from the side surface of the copper layer such that a gap is formed between the copper layer and the ceramic substrate main body. In the gap, the coating metal layer may be extended.

(3) In the present ceramic substrate, an outer surface of the contact layer may not be coated with the coating metal layer.

(4) In the present ceramic substrate, the contact layer may have a thickness of 0.05 µm or more and 0.5 µm or less.

(5) In the present ceramic substrate, the contact layer may include a metal layer having a better corrosion resistance to a soldering flux composition in the solder than titanium.

(6) In the present ceramic substrate, a metallized metal layer may be disposed on the principal surface of the ceramic substrate main body, and the metallized metal layer may be coated with a protection layer. The protection layer protects the metallized metal layer from an etching solution for etching the contact layer. The protection layer may have a thickness of 0.8 µm or more and 2.5 µm or less.

(7) According to this configuration, the protection layer coating the metallized metal layer may include a nickel-plated layer.

(8) In the present ceramic substrate, a metallized metal layer may be disposed on the principal surface of the ceramic substrate main body. The metallized metal layer may contain molybdenum. The contact layer may also contain molybdenum.

(9) In the present ceramic substrate, an LED may be connected to the connecting terminal portion as the other component.

(10) In the present ceramic substrate, the ceramic substrate main body may have a multilayer structure. Namely, in the ceramic substrate main body, a plurality of ceramic insulating layer including a ceramic material and a plurality of conductor layers including a metallized metal layer may be stacked. The ceramic insulating layer may include a via conductor containing a metallized metal, and the via conductor may be electrically connected to the connecting terminal portion.

(11) In this configuration, the ceramic material in the ceramic substrate main body may be alumina.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:
1. A ceramic substrate, comprising:
a ceramic substrate main body having a principal surface;
a connecting terminal portion disposed on the principal surface of the ceramic substrate main body for connection to a component via solder, the connecting terminal portion including a copper layer and a coating metal layer covering a surface of the copper layer; and
a contact layer disposed between the ceramic substrate main body and the copper layer, the contact layer including one of a nickel-chromium alloy, chromium, molybdenum, and palladium,
wherein the contact layer is set back from a side surface of the copper layer in a substrate plane direction such that a gap is formed between the copper layer and the ceramic substrate main body, and
wherein the coating metal layer extends into the gap.

2. The ceramic substrate according to claim 1, wherein the coating metal layer includes at least nickel.

3. The ceramic substrate according to claim 1, wherein the coating metal layer includes nickel and gold or includes nickel, palladium, and gold.

4. A ceramic substrate comprising:
a ceramic substrate main body having a principal surface;
a metallized metal layer disposed on the principal surface of the ceramic substrate main body,
a protection layer coated on the metallized metal layer for protecting the metallized metal layer from an etching solution;
a contact layer including one of a nickel-chromium alloy, chromium, molybdenum, and palladium, at least a portion of the contact layer formed on the principal surface of the ceramic substrate main body, and at least another portion of the contact layer formed on the protection layer; and
a connecting terminal portion formed on the contact layer for connection to a component via solder, the connecting terminal portion including a copper layer and a coating metal layer covering a surface of the copper layer,
wherein the contact layer is set back from a side surface of the copper layer in a substrate plane direction such that a gap is formed between the copper layer and the ceramic substrate main body, and
wherein the coating metal layer extends into the gap.

5. The ceramic substrate according to claim 4, wherein a part of the metallized metal layer coated with the protection layer is extended from a projected area of the connecting terminal portion.

6. The ceramic substrate according to claim 4, further comprising:
   an end-face through-hole conductor including a metallized metal and disposed on a side surface of the ceramic substrate main body, wherein
   a surface of the end-face through-hole conductor is coated with the protection layer.

7. A method of manufacturing the ceramic substrate according to claim 4, the method comprising:
   a firing step of forming the ceramic substrate main body and the metallized metal layer;
   a protection layer-forming step of forming the protection layer by performing nickel plating on the metallized metal layer exposed on the principal surface side of the ceramic substrate main body;
   a contact layer-forming step of forming the contact layer on a surface of the protection layer and on the principal surface of the ceramic substrate main body;
   a copper layer-forming step of forming the copper layer of the connecting terminal portion on a surface of the contact layer by performing copper plating;
   an etching step of removing the contact layer exposed on the principal surface side of the ceramic substrate main body by etching while protecting the metallized metal layer from corrosion due to the etching solution with the protection layer; and
   a coating metal layer-forming step of forming the coating metal layer on the surface of the copper layer by successively plating the surface of the copper layer with nickel and gold or with nickel, palladium, and gold.

* * * * *